(12) United States Patent
Lin et al.

(10) Patent No.: US 8,823,415 B2
(45) Date of Patent: Sep. 2, 2014

(54) LOGIC GATE

(71) Applicant: Industrial Technology Research Institute, Hsinchu (TW)

(72) Inventors: Wen-Pin Lin, Kaohsiung (TW); Chih-He Lin, Yunlin County (TW); Yu-Sheng Chen, Taoyuan County (TW); Zhe-Hui Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 147 days.

(21) Appl. No.: 13/645,493

(22) Filed: Oct. 4, 2012

(65) Prior Publication Data

US 2014/0035620 A1 Feb. 6, 2014

(30) Foreign Application Priority Data

Jul. 31, 2012 (TW) .............................. 101127643 A

(51) Int. Cl.
*H03K 19/20* (2006.01)
*H01L 23/522* (2006.01)

(52) U.S. Cl.
CPC ............ *H03K 19/20* (2013.01); *H01L 23/5228* (2013.01)
USPC ...................................................... 326/104

(58) Field of Classification Search
CPC ... H03K 19/20; H01L 23/525; H01L 23/5228
USPC ............................................ 326/3, 6–7, 104
See application file for complete search history.

(56) References Cited

U.S. PATENT DOCUMENTS

| 4,858,185 | A | 8/1989 | Kowshik et al. |
| 5,818,316 | A | 10/1998 | Shen et al. |
| 6,573,713 | B2 | 6/2003 | Torok et al. |
| 7,336,525 | B2 | 2/2008 | Fujita et al. |
| 7,835,172 | B2 * | 11/2010 | Shinozaki ..................... 365/148 |
| 8,102,018 | B2 | 1/2012 | Bertin et al. |

(Continued)

FOREIGN PATENT DOCUMENTS

| CN | 102169711 | 8/2011 |
| CN | 102412827 | 4/2012 |

OTHER PUBLICATIONS

Kimura et al., "Complementary Ferroelectric-Capacitor Logic for Low-Power Logic-in-Memory VLSI", IEEE Journal of Solid-State Circuits, vol. 39, No. 6, Jun. 2004, p. 919-p. 926.
Kim et al., "Field Programmable Stateful Logic Array", IEEE Transactions on Computer-Aided Design of Integrated Circuits and Systems, vol. 30, No. 12, Dec. 2011, p. 1800-p. 1813.

(Continued)

*Primary Examiner* — Jason M Crawford
(74) *Attorney, Agent, or Firm* — Jianq Chyun IP Office

(57) ABSTRACT

A logic gate including a first resistive non-volatile memory device and a second resistive non-volatile memory device is provided. When top electrodes of the first and the second resistive non-volatile memory devices are coupled to an output terminal of the logic gate, bottom electrodes of the first and the second resistive non-volatile memory devices are respectively coupled to a first input terminal and a second input terminal of the logic gate. When the bottom electrodes of the first and the second resistive non-volatile memory devices are coupled to the output terminal of the logic gate, the top electrodes of the first and the second resistive non-volatile memory devices are respectively coupled to the first input terminal and the second input terminal of the logic gate.

10 Claims, 6 Drawing Sheets

(56) References Cited

U.S. PATENT DOCUMENTS

| | | | |
|---|---|---|---|
| 8,207,757 B1* | 6/2012 | Chen et al. | 326/104 |
| 8,373,438 B2* | 2/2013 | Shukh | 326/37 |
| 8,437,177 B2* | 5/2013 | Katoh | 365/154 |
| 2006/0028247 A1* | 2/2006 | Hara et al. | 326/104 |
| 2007/0247196 A1* | 10/2007 | Niedermeier et al. | 326/95 |
| 2009/0051384 A1* | 2/2009 | Katayama | 326/6 |
| 2010/0078723 A1 | 4/2010 | Bertin et al. | |
| 2010/0118579 A1* | 5/2010 | Liu et al. | 365/51 |
| 2011/0001115 A1 | 1/2011 | Greene et al. | |
| 2011/0279146 A1* | 11/2011 | Koo et al. | 326/100 |
| 2011/0292718 A1* | 12/2011 | Suzuki et al. | 365/158 |

OTHER PUBLICATIONS

Yao et al., "Magnetic Tunnel Junction-Based Spintronic Logic Units Operated by Spin Transfer Torque", IEEE Transactions on Nanotechnology, vol. 11, No. 1, Jan. 2012, p. 120-p. 126.

Matsunaga et al., "MTJ-Based Nonvolatile Logic-in-Memory Circuit, Future Prospects and Issues", Design, Automation & Test in Europe Conference & Exhibition, Apr. 24, 2009, p. 433-p. 435.

Yamamoto et al., "Nonvolatile delay flip-flop using spin-transistor architecture with spin transfer torque MTJs for power-gating systems", Electronics Letters, vol. 47 No. 18, Sep. 2011, p. 1027-p. 1029.

* cited by examiner

LOGIC GATE

CROSS-REFERENCE TO RELATED APPLICATION

This application claims the priority benefit of Taiwan application serial no. 101127643, filed on Jul. 31, 2012. The entirety of the above-mentioned patent application is hereby incorporated by reference herein and made a part of this specification.

TECHNICAL FIELD

The technical field relates to an electronic circuit, and relates to a logic gate.

BACKGROUND

Integrated circuit (IC) chip miniaturization is an important development direction in the semiconductor industry. Thus, all the leading semiconductor manufacturers around the world have been focusing on the research and development of process miniaturization in the hope of integrating different digital logics, memories, and analog circuits into single chips, so as to greatly increase the operating speed and the functionality of circuits and reduce the product cost. A logic gate is an essential block in an IC. The circuit of a conventional logic gate is composed of metal oxide semiconductor (MOS) transistors. By reducing the surface area taken by each logic gate, the product density can be increased and the product cost can be reduced.

SUMMARY

An embodiment of the disclosure provides a logic gate including a first input terminal, a second input terminal, an output terminal, a first resistive non-volatile memory device and a second resistive non-volatile memory device. The first input terminal receives a first input logic value of the logic gate. The second input terminal receives a second input logic value of the logic gate. The output terminal outputs a logic operation result of the logic gate. When top electrodes of the first resistive non-volatile memory device and the second resistive non-volatile memory device are coupled to the output terminal of the logic gate, bottom electrodes of the first resistive non-volatile memory device and the second resistive non-volatile memory device are respectively coupled to the first input terminal and the second input terminal of the logic gate. When the bottom electrodes of the first resistive non-volatile memory device and the second resistive non-volatile memory device are coupled to the output terminal of the logic gate, the top electrodes of the first resistive non-volatile memory device and the second resistive non-volatile memory device are respectively coupled to the first input terminal and the second input terminal of the logic gate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The term "couple" used throughout the disclosure (including the claims) may refer to any direct or indirect connection. For example, if a first device is described as being coupled to a second device, the first device can be directly connected to the second device or indirectly connected to the second device through other devices or a specific connection technique.

Figure 1:
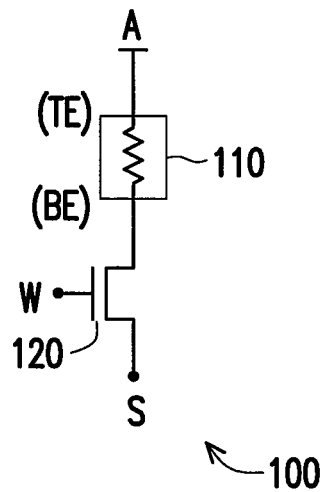
FIG. 1 is a circuit diagram of a non-volatile random access memory (RAM) according to an embodiment of the disclosure.

FIG. 1 is a circuit diagram of a non-volatile random access memory (RAM) 100 according to an embodiment of the disclosure. The non-volatile RAM 100 includes a resistive non-volatile memory device 110 and a transistor 120. The transistor 120 may be implemented by using a metal oxide semiconductor (MOS) transistor, a bipolar junction transistor (BJT), or any other type of transistor. In an embodiment, the source of the transistor 120 is coupled to a voltage S. The gate of the transistor 120 is coupled to a voltage W. The transistor 120 is turned on or off according to the control voltage W.

In an embodiment, the top electrode TE of the resistive non-volatile memory device 110 is coupled to a voltage A, and the bottom electrode BE of the resistive non-volatile memory device 110 is coupled to the drain of the transistor 120. The resistive non-volatile memory device 110 may be implemented through any technique according to the design requirement. For example, the resistive non-volatile memory device 110 may be fabricated by forming the bottom electrode BE, a variable resistor and the top electrode TE on a substrate. The bottom electrode BE may be an YBa2Cu3O7 (YBCO) film deposited on a LaAlO3 (LAO) monocrystal substrate, the variable resistor may be a Pr1-XCaXMnO3 (PCMO) film, and the top electrode TE may be an Ag film formed through sputtering deposition. In addition, besides aforementioned perovskite material, the variable resistor may also be implemented by using the ZnSe—Ge heterogeneous structure or an oxide of Ti, Nb, Hf, Zr, Ta, Ni, V, Zn, Sn, In, Th, or Al. The resistance of the variable resistor changes with the voltage pulses supplied to the top electrode TE and the bottom electrode BE. The resistance of the variable resistor can be reversibly changed according to the direction of the voltage supplied between the top electrode TE and the bottom electrode BE. The function of a resistive memory is realized by reading the resistance of the variable resistor.

The layered structure of the resistive non-volatile memory device 110 can be disposed on the top of an integrated circuit (IC) (for example, stacked on top of the transistor 120). Thus, the resistive non-volatile memory device 110 does not increase the surface area of the chip.

Figure 2:
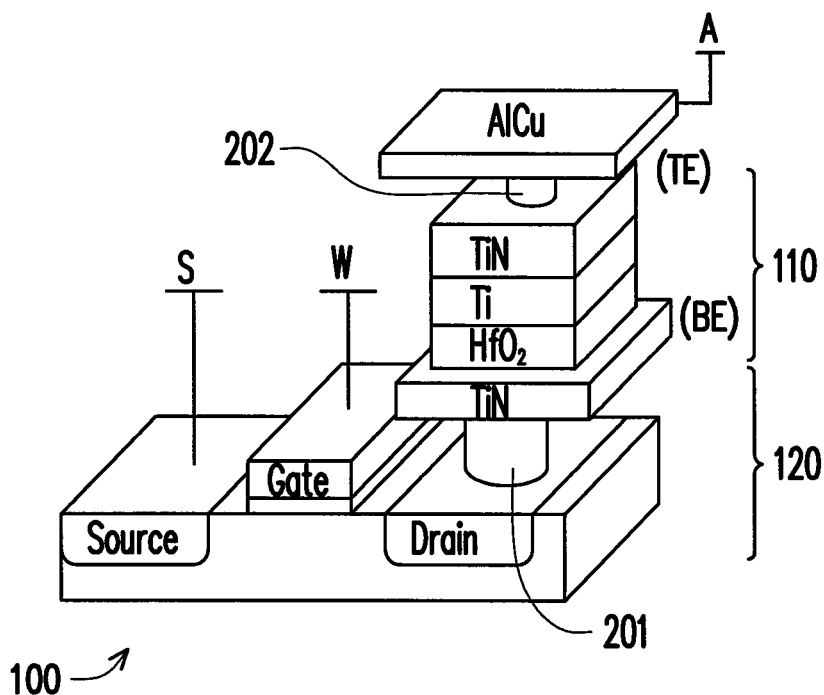
FIG. 2 is a perspective view of a resistive non-volatile memory device in FIG. 1 according to an embodiment of the disclosure.

FIG. 2 is a perspective view of the resistive non-volatile memory device 110 in FIG. 1 according to an embodiment of the disclosure. In an embodiment, the resistive non-volatile memory device 110 is disposed on the substrate of the IC. The resistive non-volatile memory device 110 is a resistive memory device having a metal/insulator/metal (MIM) structure and is formed by stacking the bottom electrode BE, the variable resistor and the top electrode TE. The bottom electrode of the resistive non-volatile memory device 110 is electrically connected to the drain of the transistor 120 through a contact plug 201. In an embodiment, the bottom electrode BE is made of TiN. In other embodiments, the bottom electrode is made of an oxide, nitride, or oxynitride of Mn, Fe, Ni, Co, Ti, Cu, V, or Si (for example, Ti, SiO2 and Si, etc). In an embodiment, an HfO2 film is coated on the bottom electrode BE through atomic layer chemical vapor deposition (ALCVD) to form the variable resistor. After the variable resistor is formed, Ti and TiN are plated on the variable resistor to form the top electrode TE. The top electrode TE may electrically connected to the voltage A through a via plug 202 and a metal interconnect. The metal interconnect may be made of Al, AlCu, any other metal, or a conductive alloy.

The operating voltages of the resistive non-volatile memory device 110 in FIG. 1 are listed in following table 1 according to an embodiment of the disclosure. During the initial stage of supplying power to the resistive non-volatile memory device 110, the non-volatile RAM 100 carries out a forming procedure (or an initialization procedure) to initialize information (resistance state) of the resistive non-volatile memory device 110 into an initial resistance state (for example, a low-resistance state). In an embodiment, during the forming procedure, the transistor 120 is turned on, the voltage A is set to a high voltage level (for example, 5V), and the voltage S is set to a low voltage level (for example, 0V). Thus, a forming current runs from the top electrode TE of the resistive non-volatile memory device 110 to the bottom electrode BE thereof. The forming current initializes the resistance state of the resistive non-volatile memory device 110 into an initial resistance state (for example, a low-resistance state).

TABLE 1

Operating Voltages of Resistive Non-Volatile Memory Device 110

| Voltage | Forming | Set (low-resistance state) | Reset (high-resistance state) |
| --- | --- | --- | --- |
| W | 1.1 V | 1.2 V | 5 V |
| A | 5 V | 2 V | 0 |
| S | 0 | 0 | 1.5 V |

In an embodiment, herein it is assumed that the low-resistance state of the resistive non-volatile memory device 110 represents the logic value 1 and the high-resistance state thereof represents the logic value 0. In an embodiment, when the system is about to write the logic value 1 into the resistive non-volatile memory device 110, a set procedure may be carried out. In the set procedure, the transistor 120 is turned on, the voltage A is set to a high voltage level (for example, 2V), and the voltage S is set to a low voltage level (for example, 0V). Thus, a set current runs from the top electrode TE of the resistive non-volatile memory device 110 to the bottom electrode BE thereof. The set current sets the resistance state of the resistive non-volatile memory device 110 to a low-resistance state (for example, 5KΩ). In addition, when the system is about to write the logic value 0 into the resistive non-volatile memory device 110, a reset procedure may be carried out. In the reset procedure, the transistor 120 is turned on, the voltage A is set to a low voltage level (for example, 0V), and the voltage S is set to a high voltage level (for example, 1.5V). Thus, a reset current runs from the bottom electrode BE of the resistive non-volatile memory device 110 to the top electrode TE thereof. The reset current sets the resistance state of the resistive non-volatile memory device 110 to a high-resistance state (greater than 100 KΩ, such as 1MΩ).

The resistive non-volatile memory device 110 is a new non-volatile memory, and which offers a high compatibility with logic fabrication processes. The resistive non-volatile memory device 110 consumes a very small volume of current when it is operating. In an embodiment, the resistive non-volatile memory device 110 is disposed above the MOS transistor 120 so that no additional surface area is consumed and the purpose of taking up less surface area is achieved. In addition, the resistive non-volatile memory device 110 offers low power consumption and data non-volatility. Below, how a logic gate is exemplary implemented by using the resistive non-volatile memory device 110 will be explained.

Figure 3:
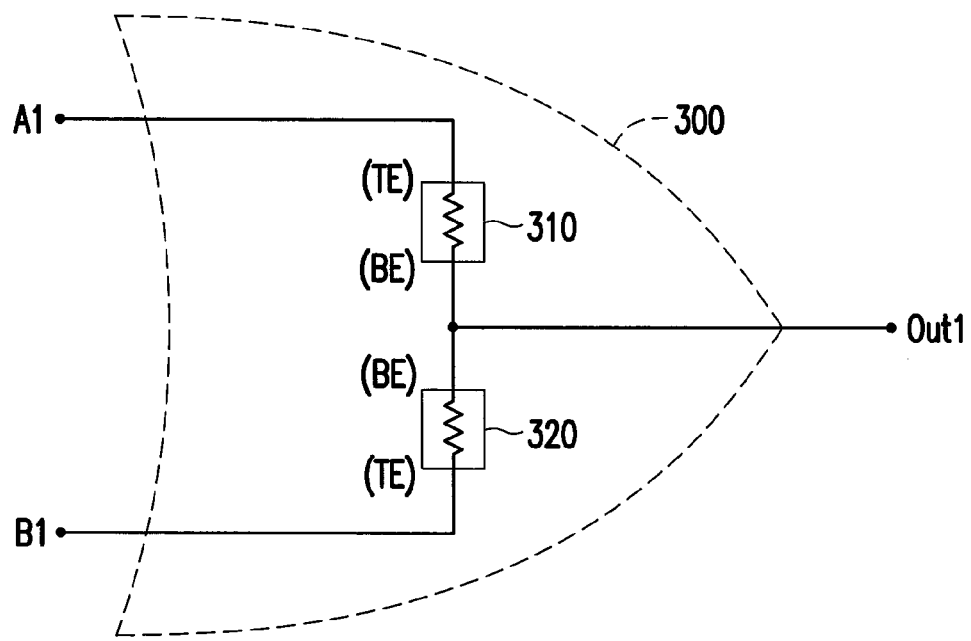
FIG. 3 is a circuit diagram of a logic gate according to an embodiment of the disclosure.

FIG. 3 is a circuit diagram of a logic gate 300 according to an embodiment of the disclosure. The logic gate 300 includes a first input terminal A1, a second input terminal B1, an output terminal Out1, a first resistive non-volatile memory device 310 and a second resistive non-volatile memory device 320. The first input terminal A1 receives a first input logic value of the logic gate 300. The second input terminal B1 receives a second input logic value of the logic gate 300. The output terminal Out1 outputs a logic operation result of the logic gate 300.

The first and second resistive non-volatile memory devices 310 and 320 can be referred to descriptions related to the resistive non-volatile memory device 110 illustrated in FIG. 1 and FIG. 2. Referring to FIG. 3, in an embodiment, the top electrode TE of the first resistive non-volatile memory device 310 is coupled to the first input terminal A1 of the logic gate 300. The top electrode TE of the second resistive non-volatile memory device 320 is coupled to the second input terminal B1 of the logic gate 300. The bottom electrodes BE of the first and second resistive non-volatile memory devices 310 and 320 are coupled to the output terminal Out1 of the logic gate 300. The bottom electrodes BE of the first and second resistive non-volatile memory devices 310 and 320 can be directly connected to the output terminal Out1. While in another embodiments, the bottom electrodes BE of the first and second resistive non-volatile memory devices 310 and 320 may also be indirectly connected to the output terminal Out1 through another device (for example, a buffer, an amplifier, or a latch). Voltages on the input terminals A1 and B1 determine the resistance states of the first and second resistive non-volatile memory devices 310 and 320. The logic gate 300 outputs an OR operation result through the output terminal Out1 according to the input logic value received by the input terminal A1 and the input logic value received by the input terminal B1. Below, the operation process of the logic gate 300 will be described.

In an embodiment, herein it is assumed that the initial resistance states of the first and second resistive non-volatile memory devices 310 and 320 are both a high-resistance state (for example, 1MΩ). When the logic value received by the input terminal A1 is "0" (for example, 0V) and the logic value received by the input terminal B1 is "1" (for example, 1.8V), a current runs from the input terminal B1 to the input terminal A1 through the second and first resistive non-volatile memory devices 320 and 310. Based on the voltage division rule, the voltages on the bottom electrodes BE of the first and second resistive non-volatile memory devices 310 and 320 are about 0.9V. Herein because of the characteristic of resistive non-volatile memory devices, the first resistive non-volatile memory device 310 performs a reset procedure, and the second resistive non-volatile memory device 320 performs a set procedure. Thus, the first resistive non-volatile memory device 310 remains in the high-resistance state while the second resistive non-volatile memory device 320 enters a low-resistance state (for example, 5KΩ). After the second resistive non-volatile memory device 320 changes its state, based on the voltage division rule, the voltages on the bottom electrodes BE of the first and second resistive non-volatile memory devices 310 and 320 are close to 1.8V. Thus, when the input terminals A1 and B1 respectively receive logic values "0" and "1", the output terminal Out1 of the logic gate 300 outputs the logic value "1".

In an embodiment, herein it is assumed that the initial resistance states of the first and second resistive non-volatile memory devices 310 and 320 are both a high-resistance state (for example, 1MΩ). When the input terminals A1 and B1 respectively receive the logic values "1" and "0", the first resistive non-volatile memory device 310 switches to the low-resistance state, and the second resistive non-volatile memory device 320 remains in the high-resistance state, so that the output terminal Out1 of the logic gate 300 outputs the logic value "1". When both the input terminals A1 and B1 receive the logic value "0", the output terminal Out1 of the logic gate 300 outputs the logic value "0". When both the input terminals A1 and B1 receive the logic value "1", the output terminal Out1 of the logic gate 300 outputs the logic value "1".

In an embodiment, herein it is assumed that the initial resistance states of the first and second resistive non-volatile memory devices 310 and 320 are both a low-resistance state (for example, 5 KΩ). When the input terminal A1 receives the logic value "0" (for example, 0V) and the input terminal B1 receives the logic value "1" (for example, 1.8V), a current runs from the input terminal B1 to the input terminal A1 through the second and first resistive non-volatile memory devices 320 and 310. Based on the voltage division rule, the voltages on the bottom electrodes BE of the first and second resistive non-volatile memory devices 310 and 320 are about 0.9V. Due to the characteristic of resistive non-volatile memory devices, the first resistive non-volatile memory device 310 performs a reset procedure, and the second resistive non-volatile memory device 320 performs a set procedure. Thus, the first resistive non-volatile memory device 310 switches to a high-resistance state (for example, 1MΩ), and the second resistive non-volatile memory device 320 remains in the low-resistance state. After the first resistive non-volatile memory device 310 switches its state, based on the voltage division rule, the voltages on the bottom electrodes BE of the first and second resistive non-volatile memory devices 310 and 320 are close to 1.8V. Thus, when the input terminals A1 and B1 respectively receive the logic values "0" and "1", the output terminal Out1 of the logic gate 300 outputs the logic value "1".

In an embodiment, herein it is assumed that the initial resistance states of the first and second resistive non-volatile memory devices 310 and 320 are both a low-resistance state (for example, 5KΩ). When the input terminals A1 and B1 respectively receive the logic values "1" and "0", the second resistive non-volatile memory device 320 switches to a high-resistance state, and the first resistive non-volatile memory device 310 remains in the low-resistance state, so that the output terminal Out1 of the logic gate 300 outputs a logic value "1". When the input terminals A1 and B1 both receive the logic value "0", the output terminal Out1 of the logic gate 300 outputs the logic value "0". When the input terminals A1 and B1 both receive the logic value "1", the output terminal Out1 of the logic gate 300 outputs the logic value "1".

In an embodiment, herein it is assumed that the initial resistance state of the first resistive non-volatile memory device 310 is a high-resistance state (for example, 1MΩ) and the initial resistance state of the second resistive non-volatile memory device 320 is a low-resistance state (for example, 5KΩ). When the input terminal A1 receives a logic value "0" (for example, 0V) and the input terminal B1 receives a logic value "1" (for example, 1.8V), based on the voltage division rule, the voltages on the bottom electrodes BE of the first and second resistive non-volatile memory devices 310 and 320 are close to 1.8V. Due to the characteristic of resistive non-volatile memory devices, the first resistive non-volatile memory device 310 performs a reset procedure and remains in the high-resistance state, and the second resistive non-volatile memory device 320 does not change its resistance state and remains in the low-resistance state. Thus, when the input terminals A1 and B1 respectively receive the logic values "0" and "1", the output terminal Out1 of the logic gate 300 outputs the logic value "1". When the input terminals A1 and B1 both receive the logic value "0", the output terminal Out1 of the logic gate 300 outputs the logic value "0". When the input terminals A1 and B1 both receive the logic value "1", the output terminal Out1 of the logic gate 300 outputs the logic value "1".

In an embodiment, herein it is assumed that the initial resistance state of the first resistive non-volatile memory device 310 is a high-resistance state (for example, 1MΩ) and the initial state of the second resistive non-volatile memory device 320 is a low-resistance state (for example, 5 KΩ). When the input terminals A1 and B1 respectively receive the logic values "1" and "0", based on the voltage division rule, the voltages on the bottom electrodes BE of the first and second resistive non-volatile memory devices 310 and 320 are about 0V. Due to the characteristic of resistive non-volatile memory devices, the first resistive non-volatile memory device 310 performs a set procedure and switches to the low-resistance state, and the second resistive non-volatile memory device 320 does not change its resistance state and remains in the low-resistance state. Based on the voltage division rule, the voltages on the bottom electrodes BE of the first and second resistive non-volatile memory devices 310 and 320 are close to 0.9V. Due to the voltages on the bottom electrodes BE of the first and second resistive non-volatile memory devices 310 and 320 are pulled up to close to 0.9V, the logic gate 300 switches its resistance state for the second time. Namely, the first resistive non-volatile memory device 310 performs a set procedure and remains in the low-resistance state, and the second resistive non-volatile memory device 320 performs a reset procedure and switches to the high-resistance state, so that the output terminal Out1 of the logic gate 300 outputs the logic value "1". Thus, when the input terminals A1 and B1 respectively receive the logic values "1" and "0", the output terminal Out1 of the logic gate 300 outputs the logic value "1".

In an embodiment, herein it is assumed that the initial resistance state of the first resistive non-volatile memory device 310 is a low-resistance state (for example, 5KΩ) and the initial resistance state of the second resistive non-volatile memory device 320 is a high-resistance state (for example, 1 MΩ). When the input terminal A1 receives a logic value "0" (for example, 0V) and the input terminal B1 receives a logic value "1" (for example, 1.8V), based on the voltage division rule, the voltages on the bottom electrodes BE of the first and second resistive non-volatile memory devices 310 and 320 are close to 0V. Due to the characteristic of resistive non-volatile memory devices, the first resistive non-volatile memory device 310 does not change its resistance state and remains in the low-resistance state, and the second resistive non-volatile memory device 320 performs a set procedure and switches to the low-resistance state. Based on the voltage division rule, the voltages on the bottom electrodes BE of the first and second resistive non-volatile memory devices 310 and 320 are close to 0.9V. Because the voltages on the bottom electrodes BE of the first and second resistive non-volatile memory devices 310 and 320 are pulled up to close to 0.9V, the logic gate 300 switches its resistance state for the second time. Namely, the first resistive non-volatile memory device 310 performs a reset procedure and switches to the high-resistance state, and the second resistive non-volatile memory device 320 performs a set procedure and remains in the low-resistance state, so that the output terminal Out1 of the logic gate 300 outputs the logic value "1". Thus, when the input terminals A1 and B1 respectively receive the logic values "0" and "1", the output terminal Out1 of the logic gate 300 outputs the logic value "1".

In an embodiment, herein it is assumed that the initial resistance state of the first resistive non-volatile memory device 310 is a low-resistance state (for example, 5 KΩ) and the initial resistance state of the second resistive non-volatile memory device 320 is a high-resistance state (for example, 1MΩ). When the input terminals A1 and B1 respectively receive the logic values "1" and "0", based on the voltage division rule, the voltages on the bottom electrodes BE of the first and second resistive non-volatile memory devices 310 and 320 are about 1.8V. Due to the characteristic of resistive non-volatile memory devices, the first resistive non-volatile memory device 310 does not change its resistance state and remains in the low-resistance state, and the second resistive non-volatile memory device 320 performs a reset procedure and remains in the high-resistance state. Thus, when the input terminals A1 and B1 respectively receive the logic values "1" and "0", the output terminal Out1 of the logic gate 300 outputs the logic value "1". When the input terminals A1 and B1 both receive the logic value "0", the output terminal Out1 of the logic gate 300 outputs the logic value "0". When the input terminals A1 and B1 both receive the logic value "1", the output terminal Out1 of the logic gate 300 outputs the logic value "1".

The operation process of the logic gate 300 illustrated in FIG. 3 is listed in following table 2. Herein RA represents the resistance state of the first resistive non-volatile memory device 310, RB represents the resistance state of the second resistive non-volatile memory device 320, H represents a high-resistance state, and L represents a low-resistance state. As indicated by table 2, the logic gate 300 is an OR gate.

TABLE 2

Operating Resistance States and True Values of Logic Gate 300

| Initial Resistance State | A1 | B1 | First Resistance State Transition | Second Resistance State Transition | Out1 |
|---|---|---|---|---|---|
| RA: H | 0 | 0 | None | None | 0 |
| RB: H | 0 | 1 | RA: H<br>RB: L | None | 1 |
|  | 1 | 0 | RA: L<br>RB: H | None | 1 |
|  | 1 | 1 | None | None | 1 |
| RA: L | 0 | 0 | None | None | 0 |
| RB: L | 0 | 1 | RA: H<br>RB: L | None | 1 |
|  | 1 | 0 | RA: L<br>RB: H | None | 1 |
|  | 1 | 1 | None | None | 1 |
| RA: H | 0 | 0 | None | None | 0 |
| RB: L | 0 | 1 | None | None | 1 |
|  | 1 | 0 | RA: L<br>RB: L | RA: L<br>RB: H | 1 |
|  | 1 | 1 | None | None | 1 |
| RA: L | 0 | 0 | None | None | 0 |
| RB: H | 0 | 1 | RA: L<br>RB: L | RA: H<br>RB: L | 1 |
|  | 1 | 0 | None | None | 1 |
|  | 1 | 1 | None | None | 1 |

Figure 4:
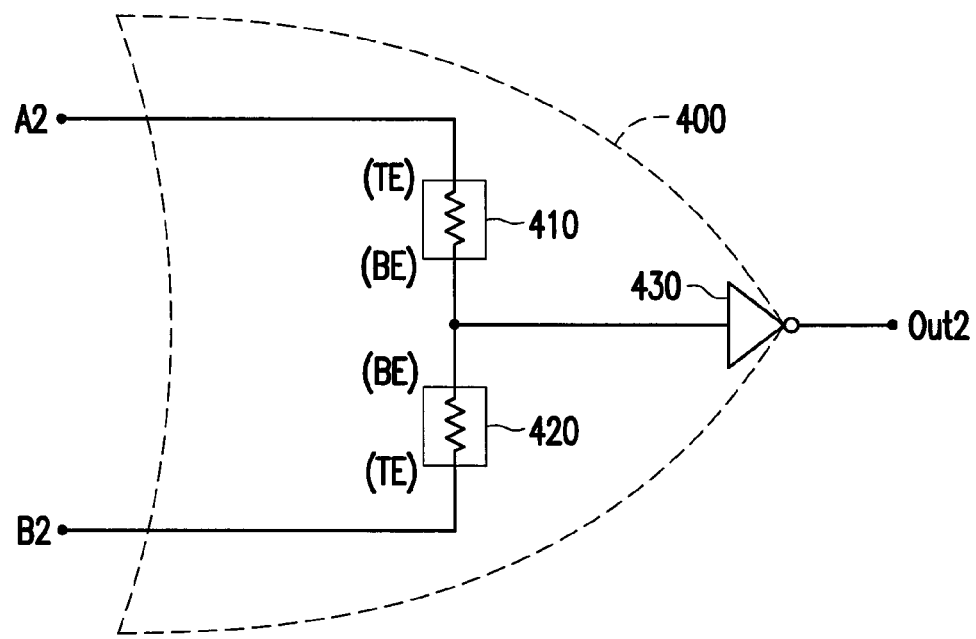
FIG. 4 is a circuit diagram of a logic gate according to another embodiment of the disclosure.

FIG. 4 is a circuit diagram of a logic gate 400 according to another embodiment of the disclosure. The logic gate 400 includes a first input terminal A2, a second input terminal B2, an output terminal Out2, a first resistive non-volatile memory device 410, a second resistive non-volatile memory device 420 and a NOT gate 430. The logic gate 400, the input terminal A2, the input terminal B2, the output terminal Out2, the first resistive non-volatile memory device 410, and the second resistive non-volatile memory device 420 illustrated in FIG. 4 can be referred to descriptions related to the logic gate 300, the input terminal A1, the input terminal B1, the output terminal Out1, the first resistive non-volatile memory device 310 and the second resistive non-volatile memory device 320 illustrated in FIG. 3. Unlike the logic gate 300 in FIG. 3, the logic gate 400 in FIG. 4 further has a NOT gate 430. Referring to FIG. 4, in an embodiment, the input terminal of the NOT gate 430 is coupled to the bottom electrodes BE of the first and second resistive non-volatile memory devices 410 and 420, and the output terminal of the NOT gate 430 is coupled to the output terminal Out2 of the logic gate 400. The logic gate 400 is an NOR gate. The logic gate 400 outputs an NOR operation result through the output terminal Out2 according to an input logic value received by the input terminal A2 and an input logic value received by the input terminal B2. As indicated by simulation data, the power consumed by the logic gate 400 (NOR gate) is about 4.8 uW when the load on the output terminal Out2 is 0.1 pF. The static power dissipation of the logic gate 400 is 0 W when the power is turned off.

Figure 5:
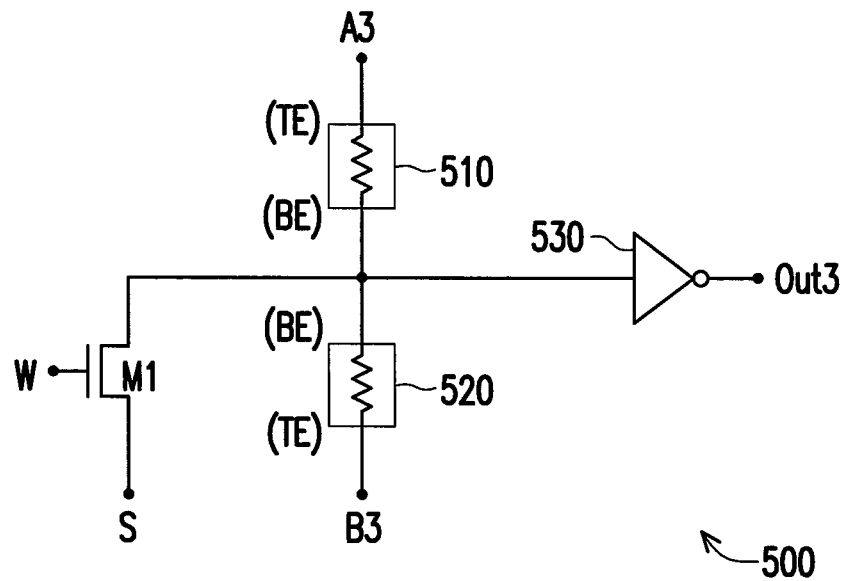
FIG. 5 is a circuit diagram of a logic gate according to another embodiment of the disclosure.

FIG. 5 is a circuit diagram of a logic gate 500 according to another embodiment of the disclosure. The logic gate 500 includes a first input terminal A3, a second input terminal B3, an output terminal Out3, a first resistive non-volatile memory device 510, a second resistive non-volatile memory device 520, a NOT gate 530 and a transistor M1. The logic gate 500, the input terminal A3, the second input terminal B3, the output terminal Out3, the first resistive non-volatile memory device 510, the second resistive non-volatile memory device 520 and the NOT gate 530 illustrated in FIG. 5 can be referred to descriptions related to the logic gate 400, the input terminal A2, the input terminal B2, the output terminal Out2, the first resistive non-volatile memory device 410, the second resistive non-volatile memory device 420 and the NOT gate 430 illustrated in FIG. 4. Unlike the logic gate 400 illustrated in FIG. 4, the logic gate 500 in FIG. 5 further has a transistor M1. Referring to FIG. 5, in an embodiment, the first terminal (for example, the source) of the transistor M1 is coupled to an initial voltage (for example, a voltage S), and the control terminal (for example, the gate) of the transistor M1 receives an initial control signal (for example, a voltage W). The transistor M1 is turned on or off according to the voltage W. The transistor M1 may be implemented by using a MOS transistor, a BJT, or any other type of transistor.

When a forming procedure (or an initialization procedure) may be performed on the first and second resistive non-volatile memory devices 510 and 520, the voltage S is set to a low voltage level (for example, 0V), and the voltage W is set to a high voltage level (for example, 1.1V). Thus, the transistor M1 is turned on, and the voltages on the bottom electrodes BE of the first and second resistive non-volatile memory devices 510 and 520 are 0V. In an embodiment, to perform a forming procedure on the first resistive non-volatile memory device 510, when the transistor M1 is turned on, the voltage on the input terminal A3 is set to an initial voltage level (for example, 5V), and the input terminal B3 is set to a floating state. To perform a forming procedure on the second resistive non-volatile memory device 520, when the transistor M1 is turned on, the voltage on the input terminal B3 is set to an initial voltage level (for example, 5V), and the input terminal A3 is set to a floating state.

When a set procedure may be performed on the first and second resistive non-volatile memory devices 510 and 520, the voltage S is set to a low voltage level (for example, 0V), and the voltage W is set to a high voltage level (for example, 1.2V). Thus, the transistor M1 is turned on, and the voltages on the bottom electrodes BE of the first and second resistive non-volatile memory devices 510 and 520 are 0V. In an embodiment, to perform a set procedure on the first resistive non-volatile memory device 510, when the transistor M1 is turned on, the voltage on the input terminal A3 is set to a predetermined voltage level (for example, 2V), and the input terminal B3 is set to a floating state. To perform a set procedure on the second resistive non-volatile memory device 520, when the transistor M1 is turned on, the voltage on the input terminal B3 is set to a predetermined voltage level (for example, 2V), and the input terminal A3 is set to a floating state.

In an embodiment, when a reset procedure may be performed on the first and second resistive non-volatile memory devices 510 and 520, the voltage S is set to a reset voltage level (for example, 1.5V), and the voltage W is set to a high voltage level (for example, 5V). Thus, the transistor M1 is turned on, and the voltages on the bottom electrodes BE of the first and second resistive non-volatile memory devices 510 and 520 are 5V. To perform a set procedure on the first resistive non-volatile memory device 510, when the transistor M1 is turned on, the voltage on the input terminal A3 is set to a low voltage level (for example, 0V), and the input terminal B3 is set to a floating state. To perform a set procedure on the second resistive non-volatile memory device 520, when the transistor M1 is turned on, the voltage on the input terminal B3 is set to a low voltage level (for example, 0V), and the input terminal A3 is set to a floating state. The transistor M1 and the forming procedure, the set procedure, and the reset procedure may also be applied to the embodiments illustrated in FIG. 3, FIG. 6 and FIG. 7.

Figure 6:
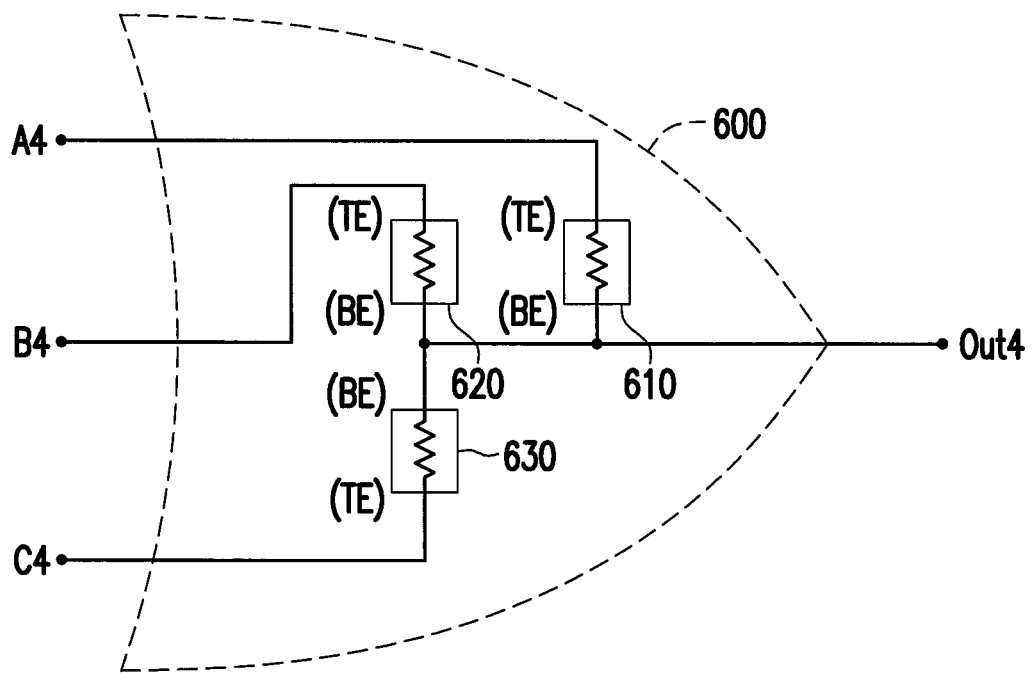
FIG. 6 is a circuit diagram of a logic gate according to another embodiment of the disclosure.

FIG. 6 is a circuit diagram of a logic gate 600 according to another embodiment of the disclosure. The logic gate 600 includes a first input terminal A4, a second input terminal B4, a third input terminal C4, an output terminal Out4, a first resistive non-volatile memory device 610, a second resistive non-volatile memory device 620 and a third resistive non-volatile memory device 630. The logic gate 600, the input terminal A4, the input terminal B4, the output terminal Out4, the first resistive non-volatile memory device 610 and the second resistive non-volatile memory device 620 illustrated in FIG. 6 can be referred to descriptions related to the logic gate 300, the input terminal A1, the input terminal B1, the output terminal Out1, the first resistive non-volatile memory device 310 and the second resistive non-volatile memory device 320 illustrated in FIG. 3. Unlike the logic gate 300 in FIG. 3, the logic gate 600 in FIG. 6 further has the third input terminal C4 and the third resistive non-volatile memory device 630.

Referring to FIG. 6, in an embodiment, the third input terminal C4 receives a third input logic value of the logic gate 600. The top electrode TE of the first resistive non-volatile memory device 610 is coupled to the first input terminal A4 of the logic gate 600. The top electrode TE of the second resistive non-volatile memory device 620 is coupled to the second input terminal B4 of the logic gate 600. The top electrode TE of the third resistive non-volatile memory device 630 is coupled to the third input terminal C4 of the logic gate 600. The bottom electrodes BE of the first, second and third resistive non-volatile memory devices 610, 620 and 630 are coupled to the output terminal Out4 of the logic gate 600. The output terminal Out4 of the logic gate 600 outputs an OR operation result according to the input logic values received by the input terminals A4, B4 and C4.

The operation process of the logic gate 600 in FIG. 6 can be deduced and understood by referring to related descriptions of FIG. 3 and is listed in following table 3. Herein RA represents the first resistance state of the resistive non-volatile memory device 610, RB represents the second resistance state of the resistive non-volatile memory device 620, RC represents the third resistance state of the resistive non-volatile memory device 630, H represents a high-resistance state, and L represents a low-resistance state. As indicated by table 3, the logic gate 600 has an OR gate with 3 inputs.

TABLE 3

Operating Resistance States and True Values of Logic Gate 600

| Initial Resistance State | A4 | B4 | C4 | First Resistance State Transition | Second Resistance State Transition | Out4 |
|---|---|---|---|---|---|---|
| RA: H<br>RB: H<br>RC: H | 0 | 0 | 0 | None | None | 0 |
|  | 0 | 0 | 1 | RA: H<br>RB: H<br>RC: L | None | 1 |
|  | 0 | 1 | 0 | RA: H<br>RB: L<br>RC: H | None | 1 |
|  | 0 | 1 | 1 | RA: H<br>RB: L<br>RC: L | None | 1 |
|  | 1 | 0 | 0 | RA: L<br>RB: H<br>RC: H | None | 1 |
|  | 1 | 0 | 1 | RA: L<br>RB: H<br>RC: L | None | 1 |
|  | 1 | 1 | 0 | RA: L<br>RB: L<br>RC: H | None | 1 |
|  | 1 | 1 | 1 | None | None | 1 |

TABLE 3-continued

Operating Resistance States and True Values of Logic Gate 600

| Initial Resistance State | A4 | B4 | C4 | First Resistance State Transition | Second Resistance State Transition | Out4 |
|---|---|---|---|---|---|---|
| RA: H<br>RB: H<br>RC: L | 0 | 0 | 0 | None | None | 0 |
|  | 0 | 0 | 1 | RA: H<br>RB: H<br>RC: L | None | 1 |
|  | 0 | 1 | 0 | RA: H<br>RB: L<br>RC: L | RA: H<br>RB: L<br>RC: H | 1 |
|  | 0 | 1 | 1 | RA: H<br>RB: H<br>RC: L | None | 1 |
|  | 1 | 0 | 0 | RA: L<br>RB: H<br>RC: L | RA: L<br>RB: H<br>RC: H | 1 |
|  | 1 | 0 | 1 | RA: H<br>RB: H<br>RC: L | None | 1 |
|  | 1 | 1 | 0 | RA: L<br>RB: L<br>RC: L | RA: L<br>RB: L<br>RC: H | 1 |
|  | 1 | 1 | 1 | None | None | 1 |
| RA: H<br>RB: L<br>RC: H | 0 | 0 | 0 | None | None | 0 |
|  | 0 | 0 | 1 | RA: H<br>RB: L<br>RC: L | RA: H<br>RB: H<br>RC: L | 1 |
|  | 0 | 1 | 0 | RA: H<br>RB: L<br>RC: H | None | 1 |
|  | 0 | 1 | 1 | RA: H<br>RB: L<br>RC: H | None | 1 |
|  | 1 | 0 | 0 | RA: L<br>RB: L<br>RC: H | RA: L<br>RB: H<br>RC: H | 1 |
|  | 1 | 0 | 1 | RA: H<br>RB: H<br>RC: H | RA: L<br>RB: H<br>RC: L | 1 |
|  | 1 | 1 | 0 | RA: H<br>RB: L<br>RC: H | None | 1 |
|  | 1 | 1 | 1 | None | None | 1 |
| RA: H<br>RB: L<br>RC: L | 0 | 0 | 0 | None | None | 0 |
|  | 0 | 0 | 1 | RA: H<br>RB: H<br>RC: L | None | 1 |
|  | 0 | 1 | 0 | RA: H<br>RB: H<br>RC: H | RA: H<br>RB: L<br>RC: H | 1 |
|  | 0 | 1 | 1 | RA: H<br>RB: L<br>RC: L | None | 1 |
|  | 1 | 0 | 0 | RA: L<br>RB: L<br>RC: L | RA: L<br>RB: H<br>RC: H | 1 |
|  | 1 | 0 | 1 | RA: L<br>RB: H<br>RC: L | None | 1 |
|  | 1 | 1 | 0 | RA: L<br>RB: L<br>RC: H | None | 1 |
|  | 1 | 1 | 1 | None | None | 1 |
| RA: L<br>RB: H<br>RC: H | 0 | 0 | 0 | None | None | 0 |
|  | 0 | 0 | 1 | RA: L<br>RB: H<br>RC: L | RA: H<br>RB: H<br>RC: L | 1 |
|  | 0 | 1 | 0 | RA: L<br>RB: L<br>RC: H | RA: H<br>RB: L<br>RC: H | 1 |
|  | 0 | 1 | 1 | RA: L<br>RB: L<br>RC: L | RA: L<br>RB: L<br>RC: H | 1 |
|  | 1 | 0 | 0 | RA: L<br>RB: H<br>RC: H | None | 1 |
|  | 1 | 0 | 1 | RA: L<br>RB: H<br>RC: H | None | 1 |
|  | 1 | 1 | 0 | RA: L<br>RB: H<br>RC: H | None | 1 |
|  | 1 | 1 | 1 | None | None | 1 |
| RA: L<br>RB: H<br>RC: L | 0 | 0 | 0 | None | None | 0 |
|  | 0 | 0 | 1 | RA: H<br>RB: H<br>RC: L | None | 1 |
|  | 0 | 1 | 0 | RA: L<br>RB: L<br>RC: L | RA: H<br>RB: L<br>RC: H | 1 |
|  | 0 | 1 | 1 | RA: L<br>RB: L<br>RC: L | None | 1 |
|  | 1 | 0 | 0 | RA: L<br>RB: H<br>RC: H | None | 1 |
|  | 1 | 0 | 1 | RA: L<br>RB: H<br>RC: L | None | 1 |
|  | 1 | 1 | 0 | RA: L<br>RB: H<br>RC: H | RA: H<br>RB: L<br>RC: H | 1 |
|  | 1 | 1 | 1 | None | None | 1 |
| RA: L<br>RB: L<br>RC: H | 0 | 0 | 0 | None | None | 0 |
|  | 0 | 0 | 1 | RA: L<br>RB: L<br>RC: L | RA: H<br>RB: H<br>RC: L | 1 |
|  | 0 | 1 | 0 | RA: H<br>RB: L<br>RC: H | None | 1 |
|  | 0 | 1 | 1 | RA: H<br>RB: L<br>RC: L | None | 1 |
|  | 1 | 0 | 0 | RA: L<br>RB: H<br>RC: H | None | 1 |
|  | 1 | 0 | 1 | RA: L<br>RB: H<br>RC: L | None | 1 |
|  | 1 | 1 | 0 | RA: L<br>RB: L<br>RC: H | None | 1 |
|  | 1 | 1 | 1 | None | None | 1 |
| RA: L<br>RB: L<br>RC: L | 0 | 0 | 0 | None | None | 0 |
|  | 0 | 0 | 1 | RA: H<br>RB: H<br>RC: L | None | 1 |
|  | 0 | 1 | 0 | RA: H<br>RB: L<br>RC: H | None | 1 |
|  | 0 | 1 | 1 | RA: H<br>RB: L<br>RC: L | None | 1 |
|  | 1 | 0 | 0 | RA: L<br>RB: H<br>RC: H | None | 1 |
|  | 1 | 0 | 1 | RA: L<br>RB: H<br>RC: L | None | 1 |
|  | 1 | 1 | 0 | RA: L<br>RB: L<br>RC: H | None | 1 |
|  | 1 | 1 | 1 | None | None | 1 |

Figure 7:
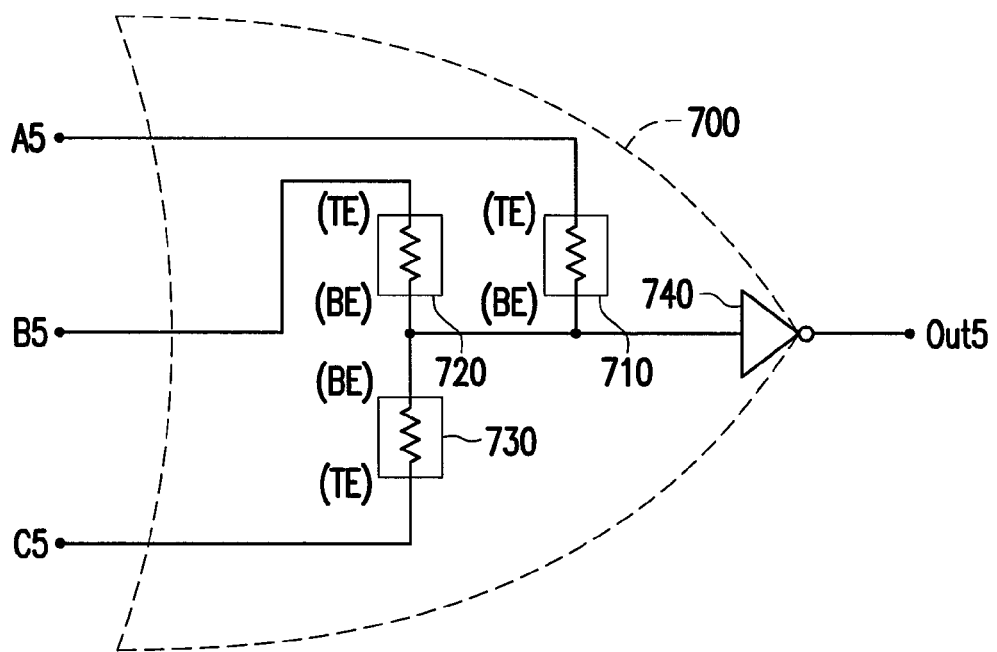
FIG. 7 is a circuit diagram of a logic gate according to another embodiment of the disclosure.

FIG. 7 is a circuit diagram of a logic gate 700 according to another embodiment of the disclosure. The logic gate 700 includes a first input terminal A5, a second input terminal B5, a third input terminal C5, an output terminal Out5, a first resistive non-volatile memory device 710, a second resistive non-volatile memory device 720, a third resistive non-volatile memory device 730 and a NOT gate 740. The logic gate 700, the input terminal A5, the input terminal B5, the input terminal C5, the output terminal Out5, and the first, second and third resistive non-volatile memory devices 710, 720 and 730 illustrated in FIG. 7 can be referred to descriptions related to the logic gate 600, the input terminal A4, the input terminal B4, the input terminal C4, the output terminal Out4, and the first, second and third resistive non-volatile memory devices 610, 620 and 630 illustrated in FIG. 6. Unlike the logic gate 600 in FIG. 6, the logic gate 700 in FIG. 7 further has the NOT gate 740. Referring to FIG. 7, in an embodiment, the input terminal of the NOT gate 740 is coupled to the bottom electrodes BE of the first, second and third resistive non-volatile memory devices 710, 720 and 730, and the output terminal of the NOT gate 740 is coupled to the output terminal Out5 of the logic gate 700. The logic gate 700 has a NOR gate with 3 inputs. The output terminal Out5 of the logic gate 700 outputs a NOR operation result according to the input logic values received by the input terminals A5, B5 and C5.

Figure 8:
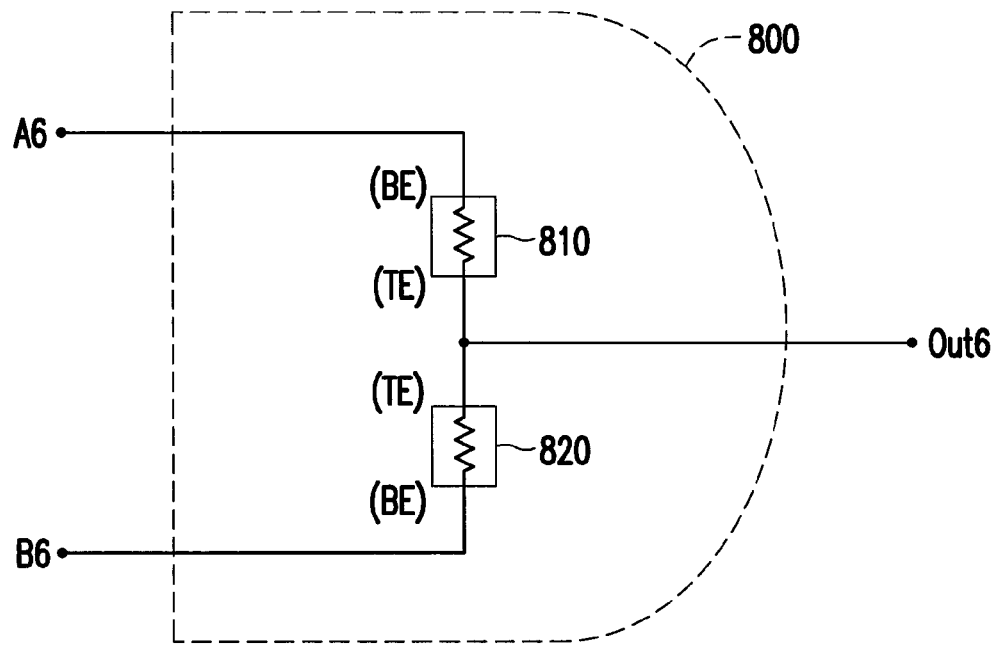
FIG. 8 is a circuit diagram of a logic gate according to another embodiment of the disclosure.

FIG. 8 is a circuit diagram of a logic gate 800 according to another embodiment of the disclosure. The logic gate 800 includes a first input terminal A6, a second input terminal B6, an output terminal Out6, a first resistive non-volatile memory device 810 and a second resistive non-volatile memory device 820. The first input terminal A6 receives a first input logic value of the logic gate 800. The second input terminal B6 receives a second input logic value of the logic gate 800. The output terminal Out6 outputs a logic operation result of the logic gate 800.

The first and second resistive non-volatile memory devices 810 and 820 can be referred to descriptions related to the resistive non-volatile memory device 110 illustrated in FIG. 1 and FIG. 2. Referring to FIG. 8, in an embodiment, the bottom electrode BE of the first resistive non-volatile memory device 810 is coupled to the first input terminal A6 of the logic gate 800. The bottom electrode BE of the second resistive non-volatile memory device 820 is coupled to the second input terminal B6 of the logic gate 800. The top electrodes TE of the first and second resistive non-volatile memory devices 810 and 820 are coupled to the output terminal Out6 of the logic gate 800. The top electrodes TE of the first and second resistive non-volatile memory devices 810 and 820 can be directly connected to the output terminal Out6. However, in other embodiments, the top electrodes TE of the first and second resistive non-volatile memory devices 810 and 820 may also be indirectly connected to the output terminal Out6 through other devices (for example, a buffer, an amplifier, or a latch). The voltages on the input terminals A6 and B6 determine the resistance states of the first and second resistive non-volatile memory devices 810 and 820. The output terminal Out6 of the logic gate 300 outputs an AND operation result according to input logic values received by the input terminal A8 and the input terminal B8.

The operation process of the logic gate 800 illustrated in FIG. 8 can be deduced and understood by referring to descriptions related to FIG. 3 and is listed in following table 4. Herein RA represents the first resistance state of the resistive non-volatile memory device 810, RB represents the second resistance state of the resistive non-volatile memory device 820, H represents a high-resistance state, and L represents a low-resistance state. As indicated by table 4, the logic gate 800 is an AND gate.

TABLE 4

Operating Resistance States and True Values of Logic Gate 800

| Initial Resistance State | A6 | B6 | First Resistance State Transition | Second Resistance State Transition | Out6 |
|---|---|---|---|---|---|
| RA: H<br>RB: H | 0 | 0 | None | None | 0 |
|  | 0 | 1 | RA: L<br>RB: H | None | 0 |
|  | 1 | 0 | RA: H<br>RB: L | None | 0 |
|  | 1 | 1 | None | None | 1 |
| RA: L<br>RB: L | 0 | 0 | None | None | 0 |
|  | 0 | 1 | RA: L<br>RB: H | None | 0 |
|  | 1 | 0 | RA: H<br>RB: L | None | 0 |
|  | 1 | 1 | None | None | 1 |
| RA: H<br>RB: L | 0 | 0 | None | None | 0 |
|  | 0 | 1 | RA: L<br>RB: L | RA: L<br>RB: H | 0 |
|  | 1 | 0 | None | None | 0 |
|  | 1 | 1 | None | None | 1 |
| RA: L<br>RB: H | 0 | 0 | None | None | 0 |
|  | 0 | 1 | None | None | 0 |
|  | 1 | 0 | RA: L<br>RB: L | RA: H<br>RB: L | 0 |
|  | 1 | 1 | None | None | 1 |

Figure 9:
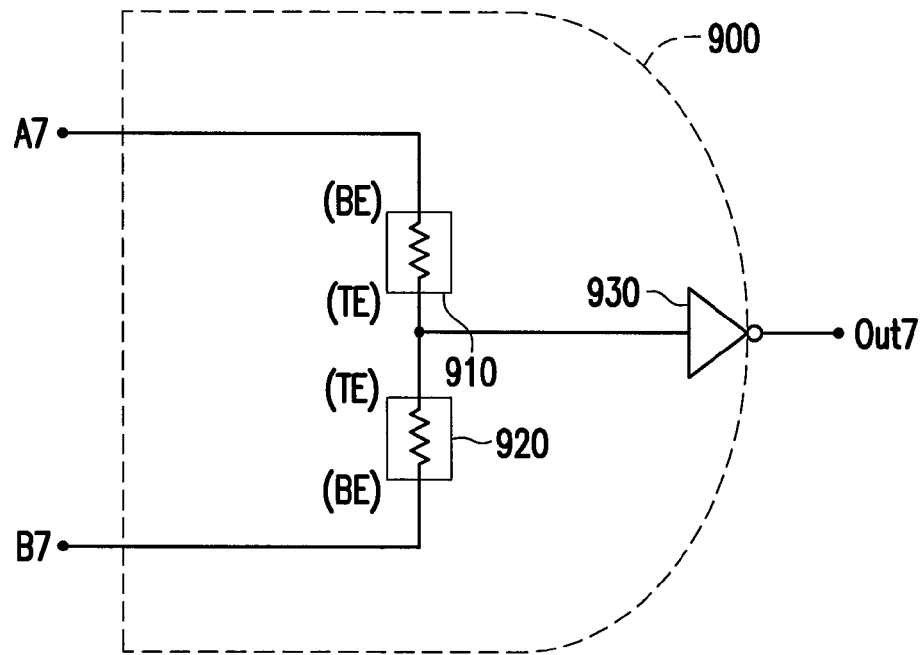
FIG. 9 is a circuit diagram of a logic gate according to another embodiment of the disclosure.

FIG. 9 is a circuit diagram of a logic gate 900 according to another embodiment of the disclosure. The logic gate 900 includes a first input terminal A7, a second input terminal B7, a output terminal Out7, a first resistive non-volatile memory device 910, a second resistive non-volatile memory device 920 and a NOT gate 930. The logic gate 900, the input terminal A7, the input terminal B7, the output terminal Out7, the first resistive non-volatile memory device 910 and the second resistive non-volatile memory device 920 illustrated in FIG. 9 can be referred to descriptions related to the logic gate 800, the input terminal A6, the input terminal B6, the output terminal Out6, the first resistive non-volatile memory device 810 and the second resistive non-volatile memory device 820 illustrated in FIG. 8. unlike the logic gate 800 in FIG. 8, the logic gate 900 in FIG. 9 further has the NOT gate 930. Referring to FIG. 9, in an embodiment, the input terminal of the NOT gate 930 is coupled to the top electrodes TE of the first and second resistive non-volatile memory devices 910 and 920, and the output terminal of the NOT gate 930 is coupled to the output terminal Out7 of the logic gate 900. The logic gate 900 is a NAND gate. The output terminal Out7 of the logic gate 900 outputs a NAND operation result according to the input logic values received by the input terminal A7 and the input terminal B7. As indicated by simulation data, when the load on the output terminal Out7 is 0.1 pF, the power consumed by the logic gate 900 (NAND gate) is about 4.5 uW, and when the power is turned off, the static power dissipation of the logic gate 900 is 0 W.

Figure 10:
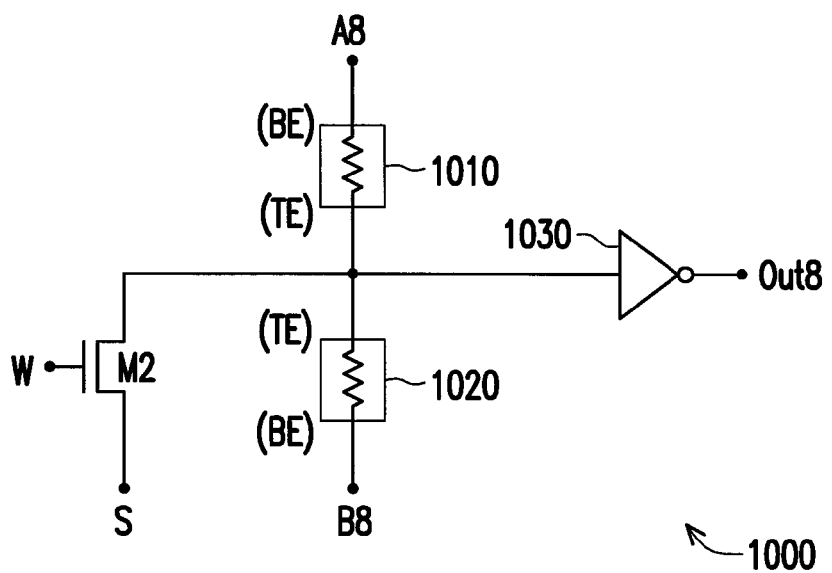
FIG. 10 is a circuit diagram of a logic gate according to another embodiment of the disclosure.

FIG. 10 is a circuit diagram of a logic gate 1000 according to another embodiment of the disclosure. The logic gate 1000 includes a first input terminal A8, a second input terminal B8, a output terminal Out8, a first resistive non-volatile memory device 1010, a second resistive non-volatile memory device 1020, a NOT gate 1030 and a transistor M2. The logic gate 1000, the input terminal A8, the second input terminal B8, the output terminal Out8, the first resistive non-volatile memory device 1010, the second resistive non-volatile memory device 1020 and the NOT gate 1030 illustrated in FIG. 10 can be referred to descriptions related to the logic gate 900, the input terminal A7, the input terminal B7, the output terminal Out7, the first resistive non-volatile memory device 910, the second resistive non-volatile memory device 920 and the NOT gate 930 illustrated in FIG. 9. Unlike the logic gate 900 in FIG. 9, the logic gate 1000 in FIG. 10 further has the transistor M2. Referring to FIG. 10, in an embodiment, the first terminal (for example, the source) of the transistor M2 is coupled to an initial voltage (for example, the voltage S), and the control terminal (for example, the gate) of the transistor M2 receives an initial control signal (for example, the voltage W). The transistor M2 is turned on or off according to the voltage W. The transistor M2 may be implemented by using a MOS transistor, a BJT, or any other type of transistor.

In an embodiment, when a forming procedure (or initialization procedure) may be performed on the resistive non-volatile memory devices 1010 and 1020, the voltage S is set to an initial voltage level (for example, 5V), and the voltage W is set to a high voltage level (for example, 1.1V). Thus, the transistor M2 is turned on, and the voltages on the top electrodes TE of the first and second resistive non-volatile memory devices 1010 and 1020 are 5V. To perform a forming procedure on the first resistive non-volatile memory device 1010, when the transistor M2 is turned on, the voltage on the input terminal A8 is set to a low voltage level (for example, 0V), and the input terminal B8 is set to a floating state. To perform a forming procedure on the second resistive non-volatile memory device 1020, when the transistor M2 is turned on, the voltage on the input terminal B8 is set to a low voltage level (for example, 0V), and the input terminal A8 is set to a floating state.

In an embodiment, when a set procedure may be performed on the first and second resistive non-volatile memory devices 1010 and 1020, the voltage S is set to a predetermined voltage level (for example, 2V), and the voltage W is set to a high voltage level (for example, 1.2V). Thus, the transistor M2 is turned on, and the voltages on the top electrodes TE of the first and second resistive non-volatile memory devices 1010 and 1020 are 2V. To perform a set procedure on the first resistive non-volatile memory device 1010, when the transistor M2 is turned on, the voltage on the input terminal A8 is set to a low voltage level (for example, 0V), and the input terminal B8 is set to a floating state. To perform a set procedure on the second resistive non-volatile memory device 1020, when the transistor M2 is turned on, the voltage on the input terminal B8 is set to a low voltage level (for example, 0V), and the input terminal A8 is set to a floating state.

In an embodiment, when a reset procedure may be performed on the first and second resistive non-volatile memory devices 1010 and 1020, the voltage S is set to a low voltage level (for example, 1V), and the voltage W is set to a high voltage level (for example, 5V). Thus, the transistor M2 is turned on, and the voltages on the top electrodes TE of the first and second resistive non-volatile memory devices 1010 and 1020 are 1V. To perform a set procedure on the first resistive non-volatile memory device 1010, when the transistor M2 is turned on, the voltage on the input terminal A8 is set to a reset voltage level (for example, 2.5V), and the input terminal B8 is set to a floating state. To perform a set procedure on the second resistive non-volatile memory device 1020, when the transistor M2 is turned on, the voltage on the input terminal B8 is set to a reset voltage level (for example, 2.5V), and the input terminal A8 is set to a floating state. The transistor M2 and the forming procedure, the set procedure, and the reset procedure may also be applied to the embodiments illustrated in FIG. 8, FIG. 11 and FIG. 12.

Figure 11:
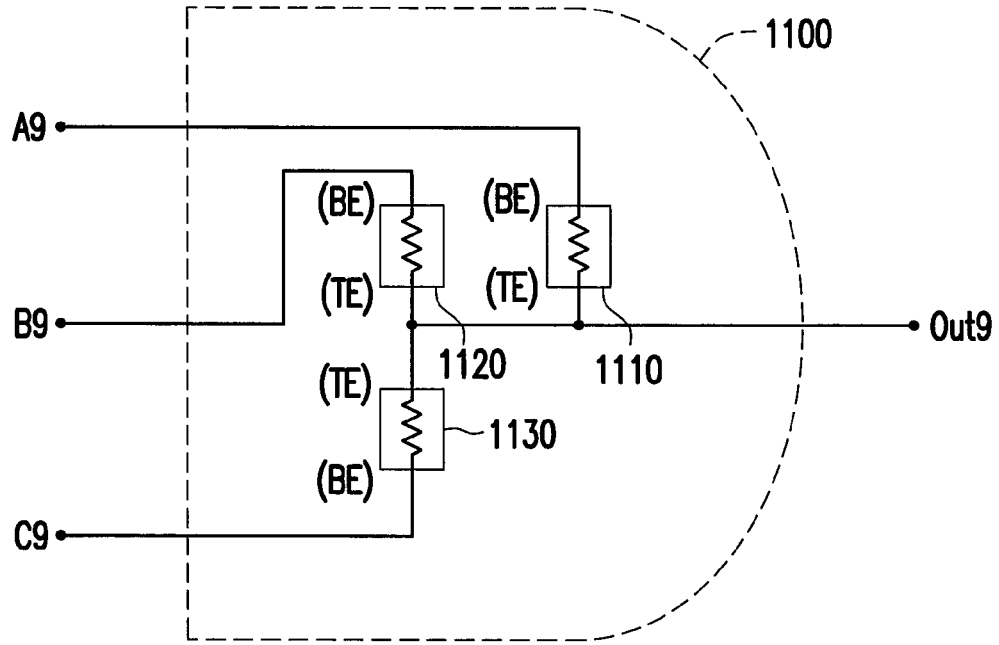
FIG. 11 is a circuit diagram of a logic gate according to another embodiment of the disclosure.

FIG. 11 is a circuit diagram of a logic gate 1100 according to another embodiment of the disclosure. The logic gate 1100 includes a first input terminal A9, a second input terminal B9, a third input terminal C9, a output terminal Out9, a first resistive non-volatile memory device 1110, a second resistive non-volatile memory device 1120 and a third resistive non-volatile memory device 1130. The logic gate 1100, the input terminal A9, the input terminal B9, the output terminal Out9, the first resistive non-volatile memory device 1110 and the second resistive non-volatile memory device 1120 illustrated in FIG. 11 can be referred to descriptions related to the logic gate 800, the input terminal A6, the input terminal B6, the output terminal Out6, the first resistive non-volatile memory device 810 and the second resistive non-volatile memory device 820 illustrated in FIG. 8. Unlike the logic gate 800 in FIG. 8, the logic gate 1100 in FIG. 11 further has the third input terminal C9 and the third resistive non-volatile memory device 1130.

Referring to FIG. 11, in an embodiment, the third input terminal C9 receives a third input logic value of the logic gate 1100. The bottom electrode BE of the first resistive non-volatile memory device 1110 is coupled to the first input terminal A9 of the logic gate 1100. The bottom electrode BE of the second resistive non-volatile memory device 1120 is coupled to the second input terminal B9 of the logic gate 1100. The bottom electrode BE of the third resistive non-volatile memory device 1130 is coupled to the third input terminal C9 of the logic gate 1100. The top electrodes TE of the first, second and third resistive non-volatile memory devices 1110, 1120 and 1130 are coupled to the output terminal Out9 of the logic gate 1100. The output terminal Out9 of the logic gate 1100 outputs an AND operation result according to the input logic values received by the input terminals A9, B9 and C9. The logic gate 1100 is a AND gate with 3 inputs.

Figure 12:
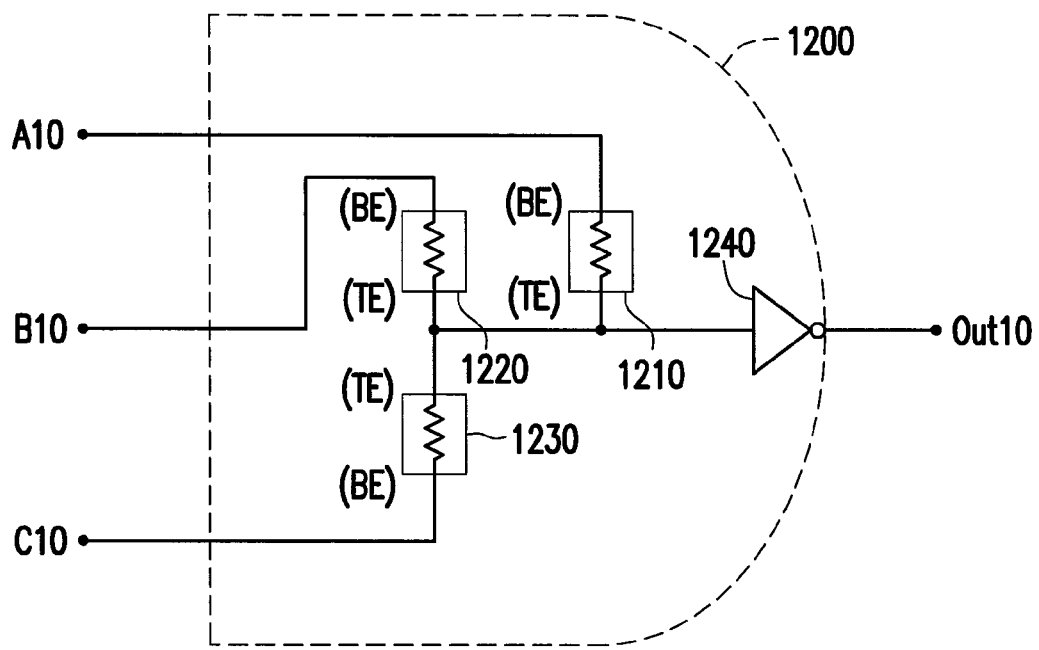
FIG. 12 is a circuit diagram of a logic gate according to another embodiment of the disclosure.

FIG. 12 is a circuit diagram of a logic gate 1200 according to another embodiment of the disclosure. The logic gate 1200 includes a first input terminal A10, a second input terminal B10, a third input terminal C10, a output terminal Out10, a first resistive non-volatile memory device 1210, a second resistive non-volatile memory device 1220, a third resistive non-volatile memory device 1230 and a NOT gate 1240. The logic gate 1200, the input terminal A10, the input terminal B10, the input terminal C10, the output terminal Out10, and the first, second and third resistive non-volatile memory devices 1210, 1220 and 1230 illustrated in FIG. 12 can be referred to descriptions related to the logic gate 1100, the input terminal A9, the input terminal B9, the input terminal C9, the output terminal Out9, and the first, second and third resistive non-volatile memory devices 1110, 1120 and 1130 illustrated in FIG. 11. Unlike the logic gate 1100 in FIG. 11, the logic gate 1200 in FIG. 12 further has the NOT gate 1240. Referring to FIG. 12, in an embodiment, the input terminal of the NOT gate 1240 is coupled to the top electrodes TE of the first, second and third resistive non-volatile memory devices 1210, 1220 and 1230. The output terminal of the NOT gate 1240 is coupled to the output terminal Out10 of the logic gate 1200. The logic gate 1200 is a NAND gate with 3 inputs. The output terminal Out10 of the logic gate 1200 outputs an NAND operation result according to input logic values received by the input terminals A10, B10 and C10.

In the embodiments described above, at least two resistive non-volatile memory devices are serially coupled with each other to realize a logic gate. The resistive non-volatile memory devices are disposed above a transistor in the integrated circuit (IC). Accordingly, the resistive non-volatile memory devices do not take up any surface area, and the purpose of reducing the surface area of the IC is accomplished. In addition, the logic gate having the resistive non-volatile memory devices offers low power consumption and data non-volatility.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A logic gate, comprising:
a first input terminal, receiving a first input logic value of the logic gate;
a second input terminal, receiving a second input logic value of the logic gate;
an output terminal, outputting a logic operation result of the logic gate;
a first resistive non-volatile memory device; and
a second resistive non-volatile memory device, wherein a bottom electrode of the first resistive non-volatile memory device and a bottom electrode of the second resistive non-volatile memory device are respectively coupled to the first input terminal and the second input terminal of the logic gate when a top electrode of the first resistive non-volatile memory device and a top electrode of the second resistive non-volatile memory device are coupled to the output terminal of the logic gate, and the top electrode of the first resistive non-volatile memory device and the top electrode of the second resistive non-volatile memory device are respectively coupled to the first input terminal and the second input terminal of the logic gate when the bottom electrode of the first resistive non-volatile memory device and the bottom electrode of the second resistive non-volatile memory device are coupled to the output terminal of the logic gate.

2. The logic gate according to claim 1, wherein the top electrode of the first resistive non-volatile memory device is coupled to the first input terminal of the logic gate, the top electrode of the second resistive non-volatile memory device is coupled to the second input terminal of the logic gate, the bottom electrode of the first resistive non-volatile memory device and the bottom electrode of the second resistive non-volatile memory device are coupled to the output terminal of the logic gate, and the output terminal of the logic gate outputs an OR operation result of the first input logic value and the second input logic value.

3. The logic gate according to claim 1 further comprising:
a NOT gate, wherein an input terminal of the NOT gate is coupled to the bottom electrode of the first resistive non-volatile memory device and the bottom electrode of the second resistive non-volatile memory device, and an output terminal of the NOT gate is coupled to the output terminal of the logic gate;
wherein the top electrode of the first resistive non-volatile memory device is coupled to the first input terminal of the logic gate, the top electrode of the second resistive non-volatile memory device is coupled to the second input terminal of the logic gate, and the output terminal of the logic gate outputs a NOR operation result of the first input logic value and the second input logic value.

4. The logic gate according to claim 1, wherein the bottom electrode of the first resistive non-volatile memory device is coupled to the first input terminal of the logic gate, the bottom electrode of the second resistive non-volatile memory device is coupled to the second input terminal of the logic gate, the top electrode of the first resistive non-volatile memory device and the top electrode of the second resistive non-volatile memory device are coupled to the output terminal of the logic gate, and the output terminal of the logic gate outputs an AND operation result of the first input logic value and the second input logic value.

5. The logic gate according to claim 1 further comprising:
a NOT gate, wherein an input terminal of the NOT gate is coupled to the top electrode of the first resistive non-volatile memory device and the top electrode of the second resistive non-volatile memory device, and an output terminal of the NOT gate is coupled to the output terminal of the logic gate;
wherein the bottom electrode of the first resistive non-volatile memory device is coupled to the first input terminal of the logic gate, the bottom electrode of the second resistive non-volatile memory device is coupled to the second input terminal of the logic gate, and the output terminal of the logic gate outputs a NAND operation result of the first input logic value and the second input logic value.

6. The logic gate according to claim 1 further comprising:
a transistor, having a first terminal coupled to an initial voltage and a control terminal receiving an initial control signal, wherein a second terminal of the transistor is coupled to the top electrode of the first resistive non-volatile memory device and the top electrode of the second resistive non-volatile memory device when the top electrode of the first resistive non-volatile memory device and the top electrode of the second resistive non-volatile memory device are coupled to the output terminal of the logic gate, and the second terminal of the transistor is coupled to the bottom electrode of the first resistive non-volatile memory device and the bottom electrode of the second resistive non-volatile memory device when the bottom electrode of the first resistive non-volatile memory device and the bottom electrode of the second resistive non-volatile memory device are coupled to the output terminal of the logic gate.

7. The logic gate according to claim 1 further comprising:
a third input terminal, receiving a third input logic value of the logic gate; and
a third resistive non-volatile memory device, wherein the top electrode of the first resistive non-volatile memory device is coupled to the first input terminal of the logic gate, the top electrode of the second resistive non-volatile memory device is coupled to the second input terminal of the logic gate, a top electrode of the third resistive non-volatile memory device is coupled to the third input terminal of the logic gate, the bottom electrode of the first resistive non-volatile memory device, the bottom electrode of the second resistive non-volatile memory device and a bottom electrode of the third resistive non-volatile memory device are coupled to the output terminal of the logic gate, and the output terminal of the logic gate outputs an OR operation result of the first input logic value, the second input logic value and the third input logic value.

8. The logic gate according to claim 1 further comprising:
a third input terminal, receiving a third input logic value of the logic gate;
a NOT gate, having an output terminal coupled to the output terminal of the logic gate; and
a third resistive non-volatile memory device, wherein the top electrode of the first resistive non-volatile memory device is coupled to the first input terminal of the logic gate, the top electrode of the second resistive non-volatile memory device is coupled to the second input terminal of the logic gate, a top electrode of the third resistive non-volatile memory device is coupled to the third input terminal of the logic gate, the bottom electrode of the first resistive non-volatile memory device, the bottom electrode of the second resistive non-volatile memory device and a bottom electrode of the third resistive non-volatile memory device are coupled to an input terminal of the NOT gate, and the output terminal of the logic gate outputs a NOR operation result of the first input logic value, the second input logic value and the third input logic value.

9. The logic gate according to claim 1 further comprising:
a third input terminal, receiving a third input logic value of the logic gate; and
a third resistive non-volatile memory device, wherein the bottom electrode of the first resistive non-volatile memory device is coupled to the first input terminal of the logic gate, the bottom electrode of the second resistive non-volatile memory device is coupled to the second input terminal of the logic gate, a bottom electrode of the third resistive non-volatile memory device is coupled to the third input terminal of the logic gate, the top electrode of the first resistive non-volatile memory device, the top electrode of the second resistive non-volatile memory device and a top electrode of the third resistive non-volatile memory device are coupled to the output terminal of the logic gate, and the output terminal of the logic gate outputs an AND operation result of the first input logic value, the second input logic value and the third input logic value.

10. The logic gate according to claim 1 further comprising:
a third input terminal, receiving a third input logic value of the logic gate;
a NOT gate, having an output terminal coupled to the output terminal of the logic gate; and
a third resistive non-volatile memory device, wherein the bottom electrode of the first resistive non-volatile memory device is coupled to the first input terminal of the logic gate, the bottom electrode of the second resistive non-volatile memory device is coupled to the second input terminal of the logic gate, a bottom electrode of the third resistive non-volatile memory device is coupled to the third input terminal of the logic gate, the top electrode of the first resistive non-volatile memory device, the top electrode of the second resistive non-volatile memory device and a top electrode of the third resistive non-volatile memory device are coupled to an input terminal of the NOT gate, and the output terminal of the logic gate outputs a NAND operation result of the first input logic value, the second input logic value and the third input logic value.

* * * * *